(12) United States Patent
Kim et al.

(10) Patent No.: US 10,636,711 B2
(45) Date of Patent: Apr. 28, 2020

(54) FLEXIBLE DISPLAY DEVICE

(71) Applicant: LG DISPLAY CO., LTD., Seoul (KR)

(72) Inventors: Miso Kim, Chilgok-gun (KR); SungJin Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/993,120

(22) Filed: May 30, 2018

(65) Prior Publication Data

US 2018/0350701 A1 Dec. 6, 2018

(30) Foreign Application Priority Data

May 31, 2017 (KR) ........................ 10-2017-0067734

(51) Int. Cl.
| | |
|---|---|
| *H01L 27/32* | (2006.01) |
| *H01L 27/12* | (2006.01) |
| *H01L 21/66* | (2006.01) |
| *G09G 3/00* | (2006.01) |
| *G09G 3/3208* | (2016.01) |
| *G02F 1/1345* | (2006.01) |
| *G02F 1/1333* | (2006.01) |
| *H01L 51/00* | (2006.01) |
| *G01R 31/26* | (2020.01) |

(52) U.S. Cl.
CPC ............ *H01L 22/34* (2013.01); *G02F 1/1345* (2013.01); *G02F 1/133305* (2013.01); *G09G 3/006* (2013.01); *G09G 3/3208* (2013.01); *H01L 27/1218* (2013.01); *H01L 27/3276* (2013.01); *G01R 31/2635* (2013.01); *G02F 2001/133388* (2013.01); *G09G 2300/0426* (2013.01); *H01L 22/32* (2013.01); *H01L 27/124* (2013.01); *H01L 51/0097* (2013.01); *H01L 2251/5338* (2013.01)

(58) Field of Classification Search
USPC ........................................................ 257/48
See application file for complete search history.

(56) References Cited

U.S. PATENT DOCUMENTS

| | | | | |
|---|---|---|---|---|
| 9,495,893 B2 * | 11/2016 | Park | ........................ | G09G 3/006 |
| 2016/0043010 A1 * | 2/2016 | Kwak | ..................... | H01L 22/14 |
| | | | | 257/48 |
| 2016/0267826 A1 * | 9/2016 | Seo | ......................... | G09G 3/006 |
| 2016/0351093 A1 * | 12/2016 | Kim | ...................... | G09G 3/2092 |
| 2018/0032190 A1 * | 2/2018 | Koide | ................... | G06F 3/0416 |
| 2018/0033354 A1 * | 2/2018 | Lee | ......................... | G09G 3/006 |

(Continued)

*Primary Examiner* — Fazli Erdem
(74) *Attorney, Agent, or Firm* — Birch, Stewart, Kolasch & Birch, LLP (57) ABSTRACT

A flexible display device can include a flexible substrate including a display area including a plurality of pixels, a first non-display area extended from the display area, a bending area extended from the first non-display area, a second non-display area extended from the bending area, and a pad area extended from the second non-display area and including a plurality of pads; a plurality of data lines configured to transmit a data voltage to the plurality of pixels; a plurality of link lines extending through the first non-display area, the bending area, the second non-display area, and the pad area to connect the plurality of data lines with the plurality of pads; and a plurality of inspection transistors arranged in the pad area, each of the plurality of inspection transistors including a first electrode connected to one of the plurality of link lines.

19 Claims, 8 Drawing Sheets

(56) References Cited

U.S. PATENT DOCUMENTS

| | | | |
|---|---|---|---|
| 2018/0053466 A1* | 2/2018 | Zhang | H01L 51/0031 |
| 2018/0122828 A1* | 5/2018 | Seto | G02F 1/1368 |
| 2018/0158741 A1* | 6/2018 | Kim | H01L 22/12 |
| 2018/0158894 A1* | 6/2018 | Park | H01L 51/0031 |
| 2018/0174505 A1* | 6/2018 | Mandlik | G09G 3/3266 |
| 2019/0019441 A1* | 1/2019 | Shin | H01L 51/0031 |

* cited by examiner

FLEXIBLE DISPLAY DEVICE

CROSS-REFERENCE TO RELATED APPLICATIONS

This application claims the priority of Republic of Korean Patent Application No. 10-2017-0067734 filed in the Republic of Korea on May 31, 2017, the disclosure of which is incorporated by reference in its entirety.

BACKGROUND

Technical Field

The present disclosure relates to a flexible display device. For instance, a flexible display device capable of reducing a bezel and inspecting signal line defects for a larger area.

Related Technology

A display device used for a monitor of a computer, a TV, or a mobile phone may include an organic light emitting display (OLED), a plasma display panel (PDP), a liquid crystal display (LCD), and the like.

In recent years, a flexible display device including a display area, various signal lines, and the like formed on a flexible substrate such as a flexible plastic material so that an image can be displayed even when the display device is bent like paper, has been attracting attention as a next generation display device.

A flexible display device has been widely applied not only to computer monitors and televisions but also to personal portable devices. Research on flexible display devices having a large display area with reduced volume and lightweight is underway.

In such a flexible display device, a technique for reducing the size of the bezel includes bending a specific area of the substrate. However, in the process of bending the substrate, the wiring, e.g., a signal line, disposed on the substrate may be cracked and the flexible display device may become defective.

SUMMARY

The inventors of the present disclosure have recognized that, when the flexible display device is bent, the wiring passing through the bending area of the flexible display device and/or the wiring disposed in the area adjacent to the bending area can be cracked. Therefore, the inventors of the present disclosure have recognized that it is necessary to inspect the wiring disposed in the bending area and the area adjacent to the bending area for any possible cracks prior to attaching a flexible film, such as a COF (Chip on Film) or an FPCB (Flexible Printed Circuit Board) on which a driving chip or the like is mounted thereon, to a flexible display device in the process of manufacturing a flexible display device.

In addition, the inventors of the present disclosure have recognized that it is important to minimize the bezel of a flexible display device as the flexible display device becomes thinner, and to provide a wider display area to the user. In particular, the inventors of the present disclosure have recognized that, in terms of design, it may be desirable to reduce the length and width of the bezel area as the flexible display device may have various shapes other than the conventional rectangular shape.

Accordingly, the inventors of the present disclosure have invented a flexible display device having a novel structure that can minimize the size of a bezel while using an inspection transistor for inspecting the wiring in wide area according to an embodiment.

Accordingly, it is an object of the present disclosure to provide a flexible display device having a structure capable of inspecting the wirings arranged in a non-display area between a display area and a pad on a flexible substrate.

Another object of the present disclosure is to provide a flexible display device capable of minimizing the size of a bezel by reducing the length of a non-display area.

It should be noted that the objects of the present disclosure are not limited to those described above and other objects of the present disclosure included in the following descriptions can be clearly understood by those skilled in the art from the following description.

In order to solve the above described problems, the flexible display device according to an embodiment of the present disclosure includes a flexible substrate including a display area in which a plurality of pixels are arranged, a first non-display area extended from the display area, a bending area extended from the first non-display area, a second non-display area extended from the bending area, and a pad area including a plurality of pads, extended from the second non-display area, a plurality of data lines, configured to transmit a data voltage to the plurality of pixels, arranged in the display area, a plurality of link lines arranged in the first non-display area, the bending area, the second non-display area, and the pad area to connect each of the plurality of data lines and each of the plurality of pads, and a plurality of inspection transistors arranged in the pad area, each of the plurality of inspection transistors including a first electrode connected to each of the plurality of link lines. Accordingly, a size of the bezel can be minimized while using an inspection transistor for inspecting signal lines in a wide area.

In order to solve above described problems, the flexible display device according to another embodiment of the present disclosure includes a flexible substrate including a display area and a non-display area extended from the display area, the non-display area includes a bending area, a plurality of data lines arranged in the display area, a plurality of link lines, connected to each of the plurality of data lines, arranged in the non-display area, and having a bending pattern in the bending area, a plurality of pads connected to each of the plurality of link lines, and a plurality of inspection transistors electrically connected to the plurality of link lines and disposed more adjacent to the plurality of pads than the bending pattern. Accordingly, any possible crack of the signal line between the bending pattern and the pad can be inspected by the inspection transistor.

More details of the embodiments are included in the detailed description and accompanying drawings.

According to the present disclosure, any possible cracks of the wirings disposed in the display area and the non-display area of the flexible substrate can be inspected and the driving of the pixels arranged on the display area can be inspected before the flexible film on which the driving chip or the like is mounted on the flexible substrate.

According to the present disclosure, the size of the bezel can be reduced by disposing the inspection transistor in a space between pads disposed in the non-display area.

It should be noted that the effects of the present disclosure are not limited to those described above and other effects of the present disclosure are included in the following descriptions.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Advantages and characteristics of the present disclosure and a method of achieving the advantages and characteristics will be clear by referring to the embodiments described below in detail together with the accompanying drawings. However, the present disclosure is not limited to the embodiment disclosed herein but will be implemented in various forms. The embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the various embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only." Any references to singular may include plural unless expressly stated otherwise.

Components are interpreted to include an ordinary error range (e.g., a tolerance range) even if not expressly stated. When the position relation between two parts is described using the terms such as "on," "above," "below," and "next," one or more parts may be positioned between the two parts unless the terms are used with the term "immediately" or "directly."

Although the terms "first," "second" and the like are used for describing various components, these components are not confined by these terms. These terms are merely used for distinguishing one component from the other components. Therefore, a first component to be mentioned below may be a second component in a technical concept of the present disclosure.

Each of the features of the various embodiments of the present disclosure can be combined or combined with each other partly or entirely. Those skilled in the art will understand that the features of the various embodiments can be technically interlocked and driven as well. The features of the various embodiments can be practiced independently or in conjunction with each other independently of each other.

Hereinafter, various embodiments of the present disclosure will be described in detail with reference to accompanying drawings.

Figure 1:
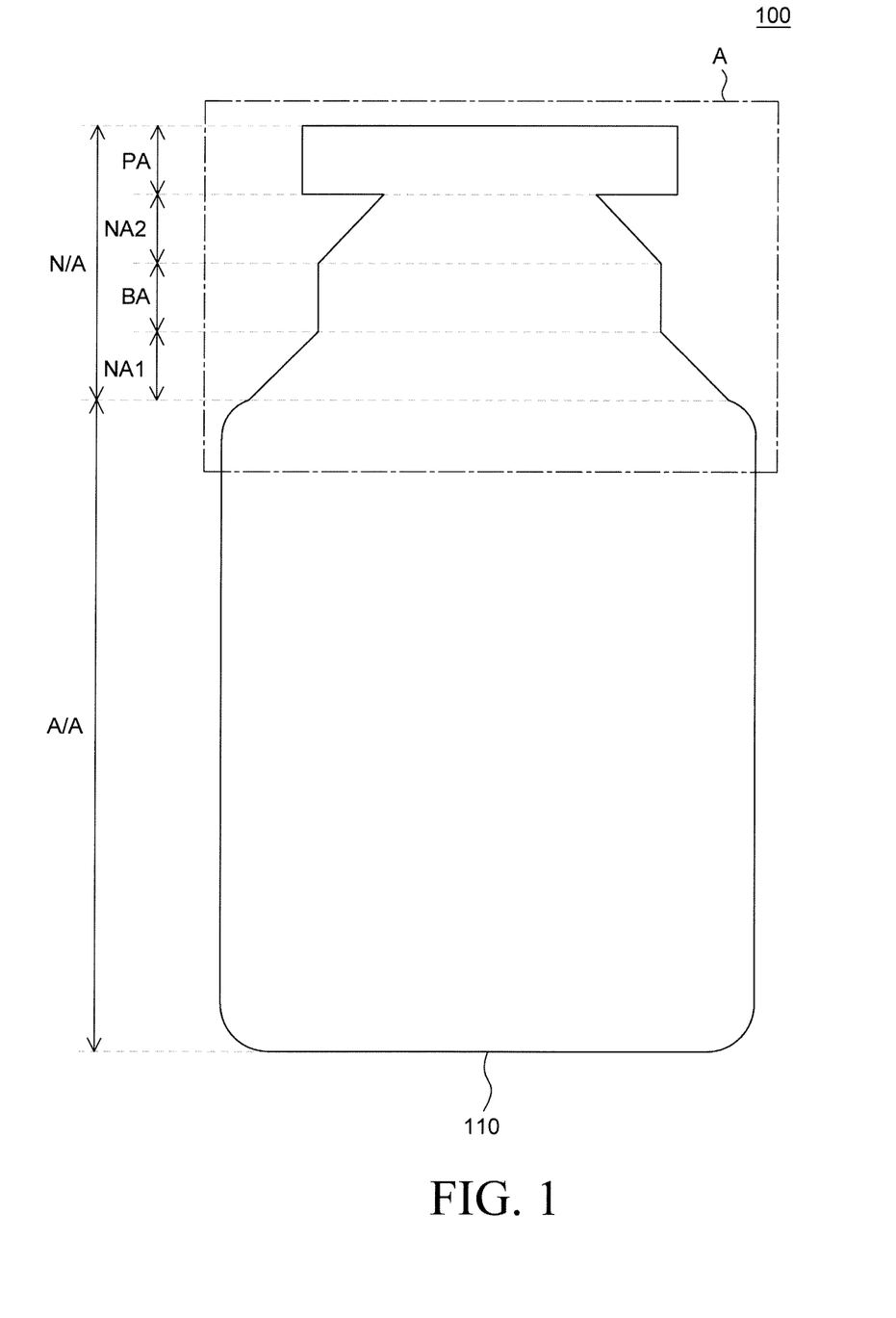
FIG. 1 is a plan view of a flexible display device according to an embodiment of the present disclosure.

FIG. 1 is a plan view of a flexible display device according to an embodiment of the present disclosure.

In FIG. 1, only the flexible substrate 110 among various components of the flexible display device 100 is illustrated for convenience of explanation.

The flexible substrate 110 is a substrate having a flexibility characteristic, and is a substrate for supporting various components of the flexible display device 100. The flexible substrate 110 may be made of a material having flexibility, for example, a plastic material such as polyimide (PI) or the like.

Referring to FIG. 1, the flexible substrate 110 includes a display area A/A and a non-display area N/A.

The display area A/A may be an area where a plurality of pixels are arranged to display an image. In the display area A/A, a display unit for displaying an image and a circuit unit for driving the display unit may be formed. For example, when the flexible display device 100 is an organic light emitting display device, the display unit may include an organic light emitting element. That is, the display unit may include an anode, an organic layer on the anode, and a cathode on the organic layer. The organic layer may include, for example, a hole-transport layer, a hole-injection layer, an organic light emission layer, an electron-injection layer, and an electron-transport layer. However, when the flexible display device 100 is a liquid crystal display device, the display unit may be configured to include a liquid crystal layer. Hereinafter, it is assumed that the flexible display device 100 is an organic light emitting display device for convenience of explanation, but the present disclosure is not limited thereto. The circuit unit may include various thin-film transistors, capacitors, and signal lines for driving the organic light emitting element. For example, the circuit unit may include various components such as a driving thin-film transistor, a switching thin-film transistor, a storage capacitor, a gate line and a data line, but the present disclosure is not limited thereto.

Referring to FIG. 1, the display area A/A may have a rounded shape. Recently, as the design aspect is emphasized, there is a need for a display area A/A other than the rectangular display area A/A. Accordingly, the flexible substrate 110 of the flexible display device 100 according to an embodiment of the present disclosure has a rounded corner shape. However, the shape of the display area A/A is not limited thereto, but may have another shape such as a rectangle according to some embodiments.

The non-display area N/A is an area where an image is not displayed, and is an area where various wirings, circuits, and the like are arranged for driving the display unit in the display area A/A. Further, in the non-display area N/A, COF, FPCB, and the like in which various ICs and driving circuits such as a gate driver IC and a data driver IC may be arranged.

The non-display area N/A may be defined as an area extending from the display area A/A as shown in FIG. 1. However, the present disclosure is not limited thereto, and the non-display area N/A may be defined to include an area surrounding the display area A/A. In addition, the non-display area N/A may be defined as extending from a plurality of sides of the display area A/A.

Referring to FIG. 1, the non-display area N/A may include a first non-display area NA1, a bending area BA, a second non-display area NA2, and a pad area PA. The first non-display area NA1 is an area extending from the display area A/A. the bending area BA can bend to an area extending from the first non-display area NA1. The second non-display area NA2 is an area extending from the bending area BA. The pad area PA is an area extending from the second non-display area NA2, a plurality of pads may be disposed in the pad area PA.

Hereinafter, the non-display area N/A will be described with reference to FIG. 2.

Figure 2:
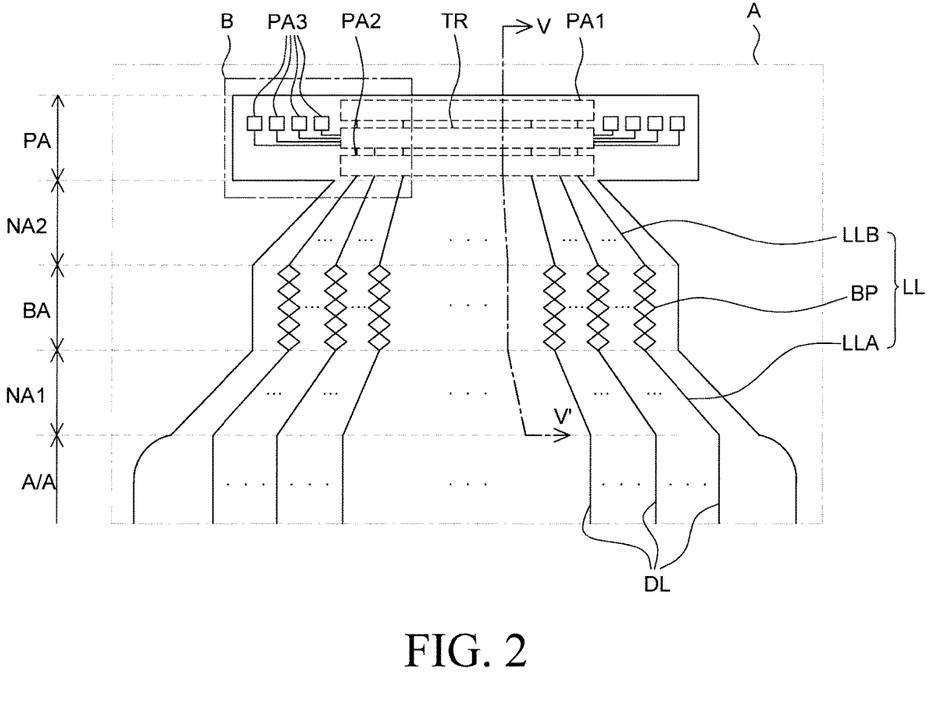
FIG. 2 is an enlarged view of the area A in FIG. 1.

FIG. 2 is an enlarged view of the area A in FIG. 1.

Referring to FIG. 2, a plurality of data lines DL are arranged in a display area A/A, a plurality of link lines LL are connected to the plurality of data lines DL in a non-display area N/A.

The plurality of data lines DL are wirings for applying data voltages to a plurality of pixels arranged in the display area A/A. The plurality of data lines DL receive data voltages from the plurality of the link lines LL and transfer the data voltages to corresponding pixels among the plurality of pixels.

The plurality of link lines LL are wirings for transmitting signals from a driver circuit, a gate driver IC, a data driver IC, or the like, which can be disposed in a non-display area N/A or disposed on a separate flexible film 120 (e.g., behind the display area), to the lines arranged in the display area A/A. In particular, the plurality of link lines LL are arranged in the first non-display area NA1, the bending area BA, the second non-display area NA2, and the pad area PA, and connects each of the plurality of data lines DL. Thus, the plurality of link lines LL can transfer data voltages to the plurality of data lines DL. In FIG. 2, it is illustrated that a plurality of link lines LL are connected to only a plurality of data lines DL. However, the plurality of link lines LL is not limited thereto, and may be connected to a gate line, a high-potential-voltage line, and the like.

The plurality of data lines DL and the plurality of link lines LL are formed of a conductive material and may be formed of a conductive material having excellent flexibility or ductility in order to minimize cracking when the flexible substrate 110 is bent. For example, a plurality of data lines DL and a plurality of link lines LL may be formed of a variety of materials, such as a gate electrode, a source electrode, and a drain electrode of the thin film transistors of the display area A/A, formed in manufacturing the organic light emitting devices. The plurality of data lines DL and the plurality of link lines LL may be formed as a single layer or a multi-layered structure. More specifically, the plurality of data lines DL and the plurality of link lines LL may be made of at least one material among molybdenum (Mo), chromium (Cr), titanium (Ti), nickel (Ni), neodymium (Nd), copper (Cu), silver (Ag), magnesium (Mg) and an alloy thereof.

Further, an average width of the display area A/A may be larger than an average width of the non-display area N/A. Specifically, as shown in FIGS. 1 and 2, the display area A/A of the display device may have a rounded corner shape, and the average width of the first non-display area NA1 extending from the display area A/A may be smaller than the average width of the display area A/A. Accordingly, the size of the bezel can be reduced in the flexible display device 100 according to an embodiment of the present disclosure.

In addition, referring to FIG. 2, the average width of the first non-display area NA1 may be larger than the average width of the bending area BA. The average width of the bending area BA may be larger than the average width of the second non-display area NA2. As described above, since it may be desirable to reduce the size of the non-display area N/A in order to reduce the size of the bezel, the width of the first non-display area NA1 may decrease as the distance from the display area A/A increases as illustrated in FIG. 2. However, the bending area BA is an area in which the bending pattern BP to be described below is placed in the area where the flexible display device 100 is actually bent. Therefore, it may be difficult to reduce the width of the bending area BA as it moves away from the display area A/A. Accordingly, in FIG. 2, although the width of the bending area BA is shown as being constant, the present disclosure is not limited thereto. Further, it may be desirable to reduce the size of the non-display area N/A in order to reduce the size of the bezel. Therefore, as illustrated in FIG. 2, the width of the second non-display area NA2 may decrease as the distance from the display area A/A is increased.

Each of the plurality of link lines LL may include a first line LLA disposed in the first non-display area NA1, a bending pattern BP disposed in the bending area BA, and a second line LLB disposed in the second non-display area NA2 and the pad area PA.

As described above, since the width of the first non-display area NA1 decreases as the distance from the display area A/A increases, the interval of the plurality of link lines LL arranged in the first non-display area NA1, that is, the separation between the first lines LLA, decreases as the distance from the display area A/A increases. Further, since the width of the second non-display area NA2 decreases as the distance from the display area A/A decreases, the interval of the plurality of link lines LL arranged in the second non-display area NA2, that is, the separation between the second lines LLB, decreases as the distance from the display area A/A increases. However, since the average width of the first non-display area NA1 is larger than the average width of the second non-display area NA2, the average interval between the first lines LLA is larger than the average interval between the second lines LLB.

The bending pattern BP of the plurality of link lines LL is arranged in the bending area BA. As described above, the bending area BA, may be an area extended from the first non-display area NA1, bent on the final product in the bending direction. Therefore, the bending pattern BP of the plurality of link lines LL can be formed in a pattern of a specific shape for minimizing cracks and stresses concentrated on the plurality of link lines LL in the bending area BA. For example, the bending pattern BP may be a pattern in which a conductive pattern having at least one of a diamond shape, a rhombic shape, a zigzag shape, and a circular shape is repeatedly arranged. However, the present disclosure is not limited thereto and the shape of the bending pattern BP may be various shapes for minimizing cracks and stresses concentrated on the plurality of link lines LL.

In FIG. 2, the bending pattern BP is disposed only on the bending area BA. However, the present disclosure is not limited thereto, and the bending pattern BP may be further disposed on the first non-display area NA1 outside the bending area BA and on some areas on the second non-display area NA2. Specifically, the bending pattern BP may be disposed in a portion of the first non-display area NA1 adjacent to the bending area BA and a portion of the second non-display area NA2.

The pad area PA is an area extending from the second non-display area NA2 where a plurality of pads PA are disposed. In addition, a plurality of inspection transistors TR for inspecting whether or not a plurality of pixels of the flexible display device 100 is turned on may be disposed in the pad area PA.

Hereinafter, the pad area PA will be described with reference to FIGS. 3 and 4 for a more detailed description.

Figure 3:
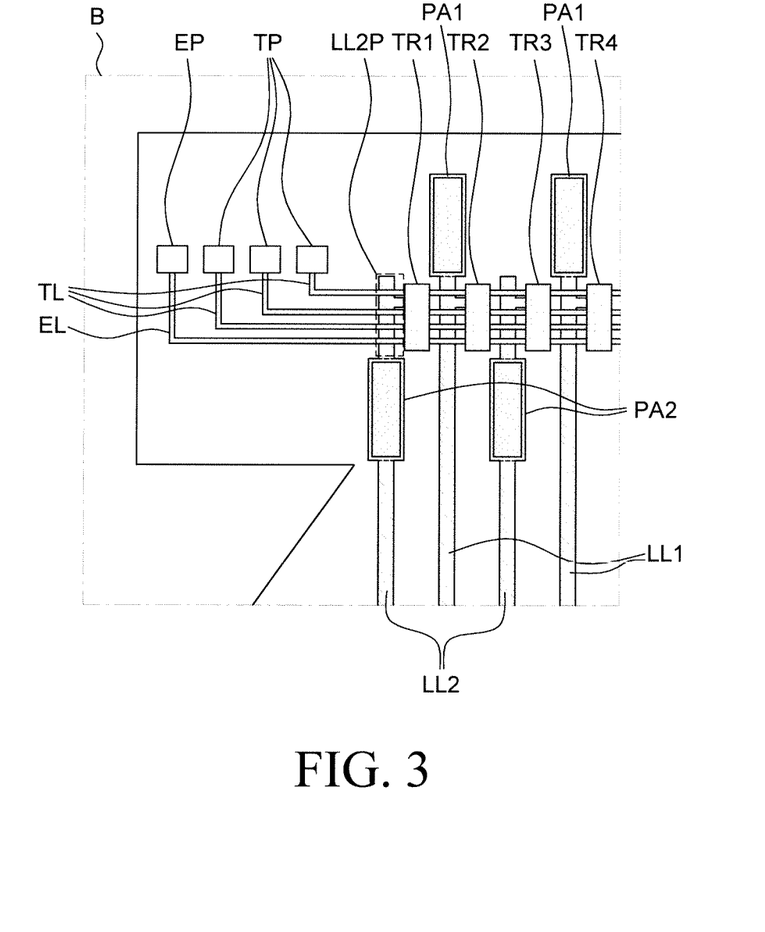
FIG. 3 is an enlarged view of the area B in FIG. 2.

FIG. 3 is an enlarged view of the area B in FIG. 2. FIG. 4 is a circuit diagram illustrating a plurality of inspection transistors of a flexible display device according to an embodiment of the present disclosure.

Referring to FIG. 3, a plurality of pads PA is disposed in the pad area PA. The plurality of pads PA may include a plurality of first pads PA1 and a plurality of second pads PA2. The plurality of first pads PA1 may be connected to a plurality of first link lines LL1 of the plurality of link lines LL and may be arranged in a line. The plurality of second pads PA2 may be connected to a plurality of second link lines LL2 of the plurality of link lines LL and may be arranged in a line. The plurality of first pads PA1 and the plurality of second pads PA2 may be alternately arranged. The plurality of first link lines LL1 and the plurality of second link lines LL2 may be alternately arranged. In addition, the plurality of second pads PA2 may be disposed adjacent to the display area A/A than the plurality of first pads PA1.

In FIG. 3, it is illustrated that the plurality of link lines LL are formed of a single layer, and the plurality of pads PA are formed of one layer made of the same material as the plurality of link lines LL and an additional layer disposed on the layer. However, the present disclosure is not limited thereto.

The plurality of inspection transistors TR1, TR2, TR3, and TR4 are transistors for checking whether a plurality of pixels arranged in the display area A/A can be turned on. The plurality of inspection transistors are transistors for detecting defects of the plurality of link lines LL disposed in the first non-display area NA1, the bending area BA, and the second non-display area NA2.

Referring to FIG. 3, a plurality of inspection transistors TR1, TR2, TR3, and TR4 may be disposed between a plurality of first pads PA1 and a plurality of second pads PA2 on a pad area PA. Further, in order to arrange a plurality of inspection transistors TR1, TR2, TR3, and, TR4, the plurality of first pads PA1 and the plurality of second pads PA2 may be spaced apart from each other and disposed in the pad area PA.

The plurality of inspection transistors TR1, TR2, TR3, and TR4 are connected to each of the plurality of link lines LL. Referring to FIG. 3, for example, the first inspection transistor TR1 and the third inspection transistor TR3 may be respectively connected to second link lines LL2 different from each other. Further, the second inspection transistor TR2 and the fourth inspection transistor TR4 may be connected to different first link lines LL1.

Figure 4:
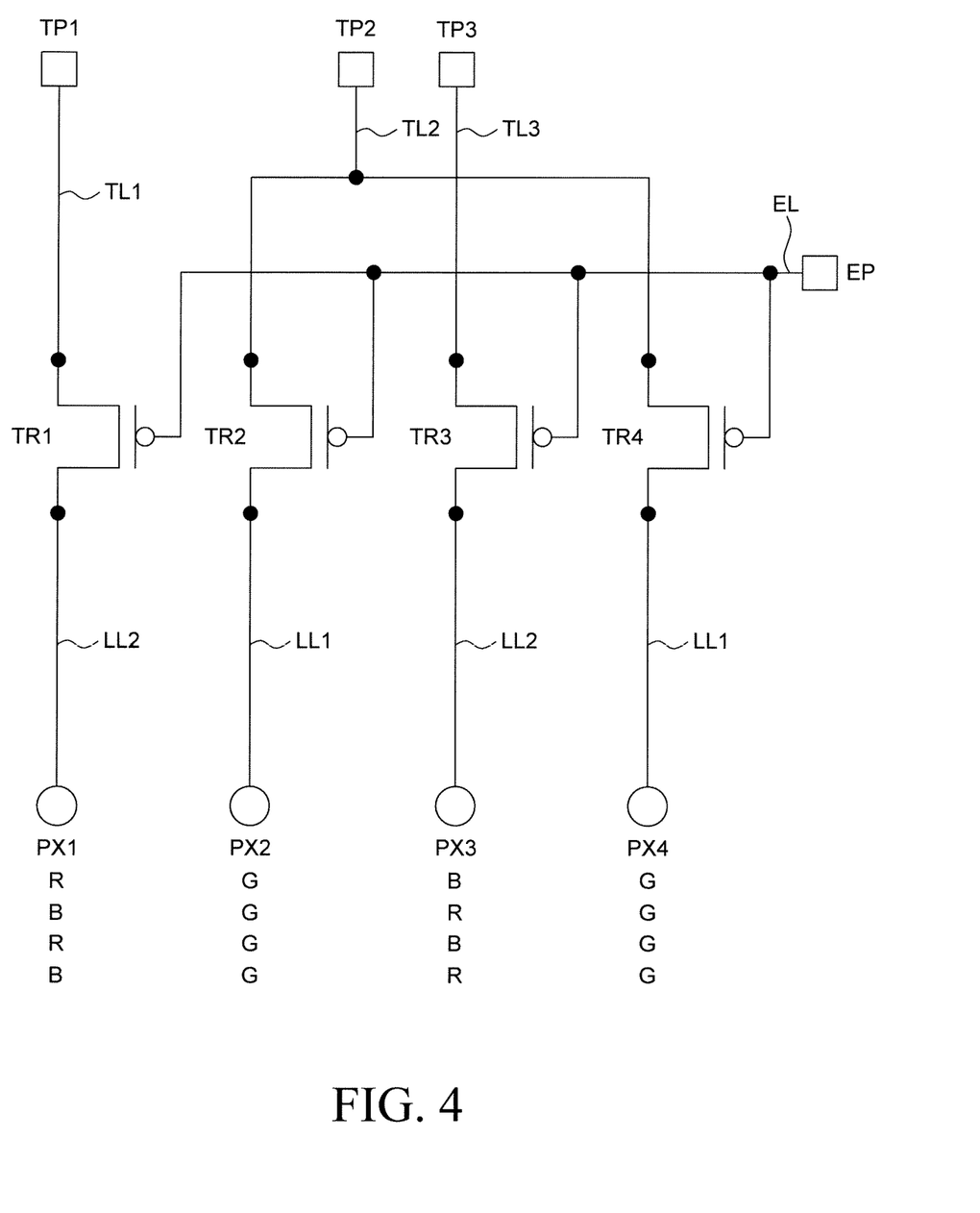
FIG. 4 is a circuit diagram illustrating a plurality of inspection transistors of a flexible display device according to an embodiment of the present disclosure.

Although four inspection transistors TR1, TR2, TR3, and TR4 are illustrated as merely for the sake of convenience of explanation in FIGS. 3 and 4, the number and types of the inspection transistors TR1, TR2, TR3, and TR4 to be used may vary depending on the arrangement and shape of the pixels arranged in the display area A/A.

Each of the plurality of inspection transistors TR1, TR2, TR3, and TR4 may include a first electrode connected to each of the plurality of link lines LL. Here, the first electrode may be one of a source electrode and a drain electrode as an output terminal of the plurality of inspection transistors TR.

To connect the first inspection transistor TR1 and the third inspection transistor TR3 to the corresponding second link line LL2, each of the plurality of second link lines LL2 may include a protruding portion LL2P extending from the plurality of second pads PA2 toward the plurality of first pads PA1 The first electrodes of the plurality of inspection transistors TR1, TR2, TR3 and TR4 can be connected to the corresponding second link line LL2 at the protruding portion LL2P of each of the plurality of second link lines LL2.

Referring to FIG. 3, an enable signal line EL for applying an enable signal to a plurality of inspection transistors TR1, TR2, TR3 and TR4 may be arranged in the pad area PA. A plurality of inspection data lines TL for applying an inspection data voltage to a plurality of inspection transistors TR1, TR2, TR3 and TR4 may be arranged in the pad area PA. In FIG. 3, it is illustrated that one enable signal line EL and three inspection data lines TL correspond to the four inspection transistors TR1, TR2, TR3, and TR4. Since a larger number of inspection transistors are used in the actual flexible display device 100, the number of the enable signal lines EL may also be plural. Further, the number of enable signal lines EL and inspection data lines TL to be used may vary depending on the arrangement and shape of the pixels arranged in the display area A/A.

Referring to FIGS. 2 and 3, a plurality of inspection pads PA3 connected to an enable signal line EL and a plurality of inspection data lines TL may be disposed in the pad area PA. The plurality of inspection pads PA3 may include an enable signal pad EP connected to the enable signal line EL and an inspection data pad TP connected to the inspection data line TL.

Reference is now made to FIG. 4 for a more detailed description of the operation of the inspection transistor.

In FIG. 4, it is assumed that a plurality of pixels of the display area A/A are repeatedly arranged in four pixel lines PX1, PX2, PX3, and PX3 for convenience of explanation. That is, it is assumed that in FIG. 4, the first pixel line PX1 in which the red pixel R and the blue pixel B are alternately arranged, the second pixel line PX2 in which only the green pixel G is arranged, the third pixel line PX3 in which blue pixel B and the red pixel R are alternatively arranged, and the fourth pixel line PX4 in which only the green pixel G is arranged in the display area A/A. However, the present disclosure is not limited thereto, and a plurality of pixels of the display area A/A may be arranged in various arrangements.

Referring to FIG. 4, an enable signal line EL is connected to a gate electrode of a plurality of inspection transistors TR1, TR2, TR3, and TR4, and a plurality of inspection data lines TL are connected to a source electrode or a drain electrode. More specifically, the enable signal line EL may be connected to the gate electrodes of the first inspection transistor TR1, the second inspection transistor TR2, the third inspection transistor TR3 and the fourth inspection transistor TR4. In addition, one of the source electrode and the drain electrode of the first inspection transistor TR1 is connected to the first inspection data line TL1 extending from the first inspection data pad TP1. The other of the source electrode and the drain electrode of the first inspection transistor TR1 is connected to a second link line LL2 electrically connected to the first pixel line PX1. One of the source electrode and the drain electrode of the second inspection transistor TR2 is connected to the second inspection data line TL2 extending from the second inspection data pad TP2. The other of the source electrode and the drain electrode of the second inspection transistor TR2 is connected to a first link line LL1 electrically connected to the second pixel line PX2. One of the source electrode and the drain electrode of the third inspection transistor TR3 is connected to the third inspection data line TL3 extending from the third inspection data pad TP3. The other of the source electrode and the drain electrode of the third inspection transistor TR3 is connected to a second link line LL2 electrically connected to the third pixel line PX3. One of the source electrode and the drain electrode of the fourth inspection transistor TR4 is connected to the second inspection data line TL2 extending from the second inspection data pad TP2. The other of the source electrode and the drain electrode of the fourth inspection transistor TR4 is connected to a first link line LL1 electrically connected to the fourth pixel line PX4.

An enable signal can be applied to the gate electrodes of the plurality of inspection transistors TR1, TR2, TR3, and TR4 through the enable signal pad EP for checking whether a plurality of pixels can be turned on and detecting any defects of the plurality of link lines LL by using the plurality of inspection transistors TR1, TR2, TR3 and TR4. As the enable signal is applied, a plurality of inspection transistors TR1, TR2, TR3, and TR4 can be turned on. Subsequently, the inspection data voltage is applied to the source electrode or the drain electrode of the plurality of inspection transistors TR1, TR2, TR3 and TR4 through the inspection data pad TP, thereby checking whether the plurality of pixels are turned on and detecting the failure of the link lines LL.

Specifically, when the first inspection transistor TR1 is turned on, an inspection data voltage is applied through the first inspection data line TL1 to turn on/off the pixels arranged in the first pixel line PX1 and the defective of the data line and the second link line electrically connected to the first pixel line PX1 can be detected. That is, when the first pixel line PX1 is not turned on when the inspection data voltage is applied, then at least one of the pixels of the second link line LL2, the data line DL, and the first pixel line PX1 may be detected as being defective. At this time, the first inspection transistor TR1 is disposed between the first pad PA1 and the second pad PA2. Therefore, it is possible to detect whether the second link line LL2 is defective in all of the non-display areas N/A, for example, disconnection can be detected through the first inspection transistor TR1.

By the same principle as described above, when the second inspection transistor TR2 and the fourth inspection transistor TR4 are turned on, an inspection data voltage is applied through the second inspection data line TL2 to check whether the pixels arranged in the second pixel line PX2 and the fourth pixel line PX4 can be turned on and any defects with respect to the data line DL1 and the first link line LL1 electrically connected to each of the second pixel line PX2 and the fourth pixel line PX4 can be detected. In addition, when the third inspection transistor TR3 is turned on, an inspection data voltage is applied through the third inspection data line TL3 to determine whether the pixels arranged in the third pixel line PX3 can be turned, thereby detecting any defects of the data line DL and the second link line LL2 electrically connected to the third pixel line PX3.

It is illustrated in FIGS. 2 and 3 that the inspection pad PA3 including the enable signal pad EP and the inspection data pad TP, the enable signal line EL, and the inspection data line TL are all arranged in the pad area PA of the flexible substrate 110. However, a part of the inspection pad PA3 and the enable signal line EL and the inspection data line TL may be removed from the final manufactured product.

Since the inspection pad PA3, the enable signal line EL and the inspection data line TL may be all configured for turn on inspection before the flexible film 120 is attached, a part of the pad area PA in which the inspection pad PA3, the enable signal line EL and the inspection data line TL may be removed after the turn on inspection process has been completed, thereby achieving a narrower bezel.

Figure 5:
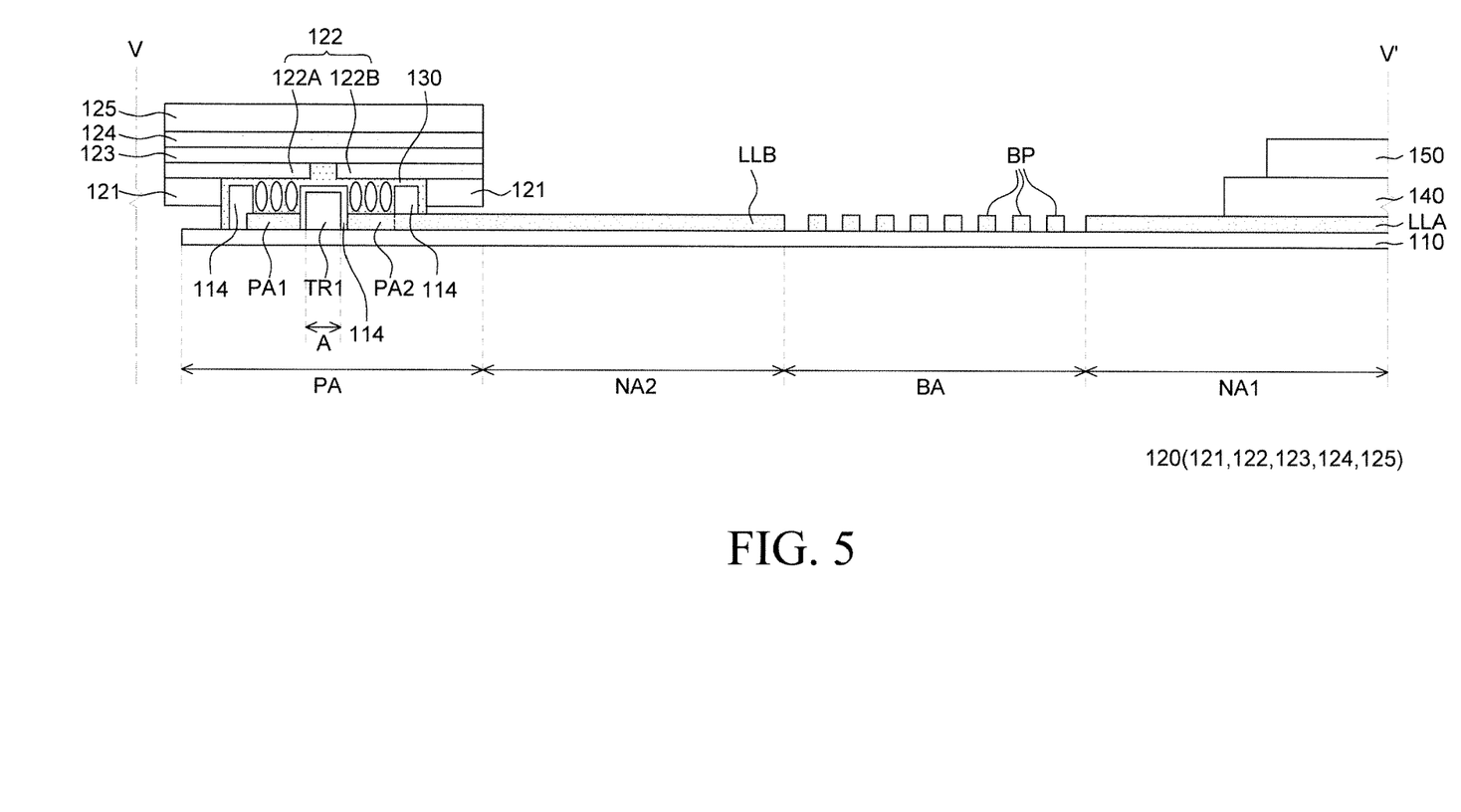
FIG. 5 is a cross-sectional view of a flexible display device according to an embodiment of the present disclosure, taken along line V-V' of FIG. 2.

FIG. 5 is a cross-sectional view of a flexible display device according to an embodiment of the present disclosure, taken along line V-V' of FIG. 2. In FIG. 5, for convenience of explanation, the cross sectional view of the first inspection transistor TR1 among the plurality of inspection transistors TR is illustrated. Referring to FIG. 5, the polarizer 150 and the touch film 140 may be disposed on the flexible substrate 110 of the flexible display device 100. The touch film 140 may be disposed in a display area including the organic light emitting element and a part of the non-display area N/A to sense the touch input. The touch film 140 may include a base member and touch electrodes disposed on the base member. However, the present disclosure is not limited thereto. The polarizer 150 is disposed on the touch film 140 to reduce reflection of external light incident on the flexible display device 100. However, the flexible display device 100 as illustrated in FIG. 5 is merely an example, and the touch film 140 and the polarizer 150 may be omitted in some embodiments of the flexible display device 100.

Referring to FIG. 5, a flexible film 120 connected to the first pad PA1 and the second pad PA2 is disposed on the pad area PA. The flexible film 120 may include a base layer 123, a first conductive layer 122, a second conductive layer 124, a first passivation layer 121 and a second passivation layer 125. That is, the flexible film 120 may be implemented with a COF having two conductive layers.

The base layer 123 is a layer for supporting the flexible film 120. The base layer 123 may be made of an insulating material, for example, an insulating material having flexibility. The first conductive layer 122 may be disposed on the lower surface of the base layer 123 and the second conductive layer 124 may be disposed on the upper surface of the base layer 123. The first conductive layer 122 and the second conductive layer 124 may be made of a metal material having excellent conductivity. The first passivation layer 121 may cover at least a portion of the first conductive layer 122. The second passivation layer 125 may cover at least a portion of the second conductive layer 124. The first passivation layer 121 and the second passivation layer 125 may be made of an insulating material such as a solder resist. The first conductive layer 122 and the second conductive layer 124 of the flexible film 120 may be variously patterned according to the number and arrangement of the pads connected to the flexible film 120. In FIG. 5, since the flexible film 120 is connected to the plurality of first pads PA1 and the plurality of second pads PA2 of the pad area PA, thus, the first conductive layer 122 may include a plurality of first conductive patterns 122A connected to the plurality of first pads PA1 and a plurality of second conductive patterns 122B connected to the plurality of second pads PA2.

The flexible film 120 may be disposed on the plurality of first pads PA1, the plurality of second pads PA2, and the plurality of inspection transistors TR in the pad area PA. Accordingly, the plurality of inspection transistors TR may overlap with the flexible film 120.

In order to electrically connect each of the plurality of first conductive patterns 122A and the plurality of second conductive patterns 122B of the first conductive layer 122 of the flexible film 120 to the plurality of first pads PA1 and the plurality of second pads PA1, an adhesive layer 130 including conductive particles may be disposed between the flexible film 120 and the first and second pads PA1 and PA2. The adhesive layer 130 may be anisotropic conductive film (ACF). The first conductive pattern 122A is electrically connected to the first pad PA1 through the conductive particles of the adhesive layer 130 and the second conductive pattern 122B is electrically connected to the second pad PA2 through the conductive particles of the adhesive layer 130.

At this time, the planarization layer 114, which is an organic film, may be provided between the plurality of inspection transistors TR and the flexible film 120 to insulate the plurality of inspection transistors TR from the flexible film 120 and the adhesive layer 130. The planarization layer 114 may be formed of the same material as the planarization layer 114 disposed in the display area A/A.

Display devices have been widely applied to monitors, TVs, smart phones, and watches. Thus, flexible display devices having a large display area with reduced volume and lightweight have been studied. Consequently, it has been studied by the inventors of the present disclosure to reduce the size of the bezel of the flexible display device. In addition, a technique of bending the non-display area of the substrate is studied to reduce the size of the bezel. Further, it is recognized by the inventors of the present disclosure that in the process of bending the substrate, cracks may be generated in the wiring or the insulating layer disposed on the substrate, resulting in defects. In particular, cracks may occur in the wiring or the insulating layer near the bending area. Thus, if a flexible film such as a COF or an FPCB mounted with a driving chip or the like is adhered in such a defective situation, the attached flexible film will be discarded, so that the manufacturing cost of the flexible display device can be greatly increased.

In order to solve such a problem, the flexible display device 100 according to an embodiment of the present disclosure may include a plurality of inspection transistors TR capable of checking cracks on the wirings disposed on the substrate before the flexible film 120 such as COF, FPCB and the like on which the driving chip is mounted is attached.

At this time, a plurality of inspection transistors TR may be arranged in the pad area PA. Accordingly, the plurality of inspection transistors TR can inspect any defects of the wirings disposed in the entire area of the flexible display device 100 from pad area PA to the second non-display area NA2, the bending area BA, the first non-display area NA1, and the display area A/A. In addition, the plurality of inspection transistors TR also can inspect up to the bending area BA where the cracks of the wiring and the insulating layer are likely to occur, the first non-display area NA1 and the second non-display area NA2 near the bending area BA, thereby inspecting defects of the link lines LL arranged in all the areas of the non-display area NA.

Further, a plurality of first pads PA1 and a plurality of second pads PA2 disposed on the pad area PA are attached with a flexible film 120 having a driving chip mounted thereon. Thus, a data voltage for driving the display area A/A may be applied. Further, the plurality of first pads PA1 and the plurality of second pads PA2 may be spaced apart from each other by a predetermined distance so that the flexible film 120 may be attached thereto.

In order to reduce the size of the non-display area N/A of the flexible display device 100 according to an embodiment of the present disclosure, the plurality of inspection transistors TR may be placed in space between a plurality of first pads PA1 and a plurality of second pads PA2. Therefore, the flexible display device 100 according to an embodiment of the present disclosure may not need to arrange an additional area for arranging the plurality of inspection transistors TR in the non-display area N/A. Consequently, the size of the non-display area N/A can be reduced as compared with the conventional flexible display device.

Hereinafter, FIGS. 6 and 7 will be referred to for a more detailed description of the effects of the flexible display device 100 according to an embodiment of the present disclosure.

Figure 6:
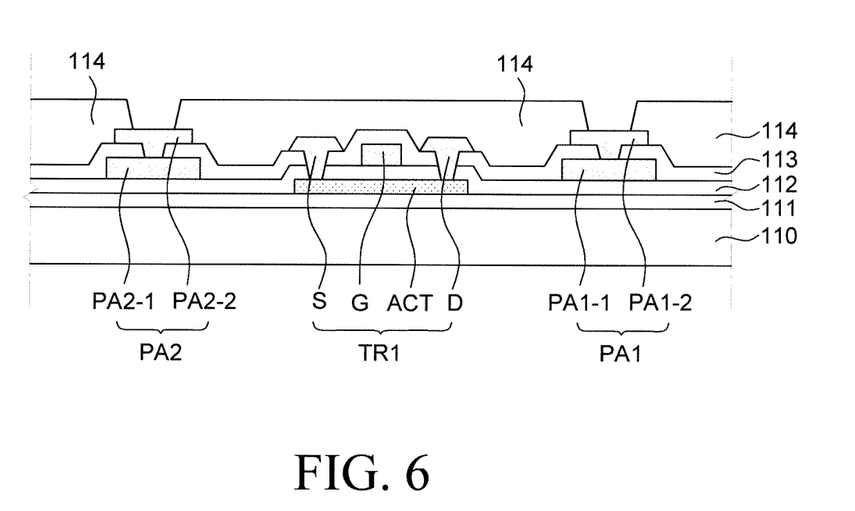
FIGS. 6 and 7 are cross-sectional views of a flexible display device according to a comparative example.
Figure 7:
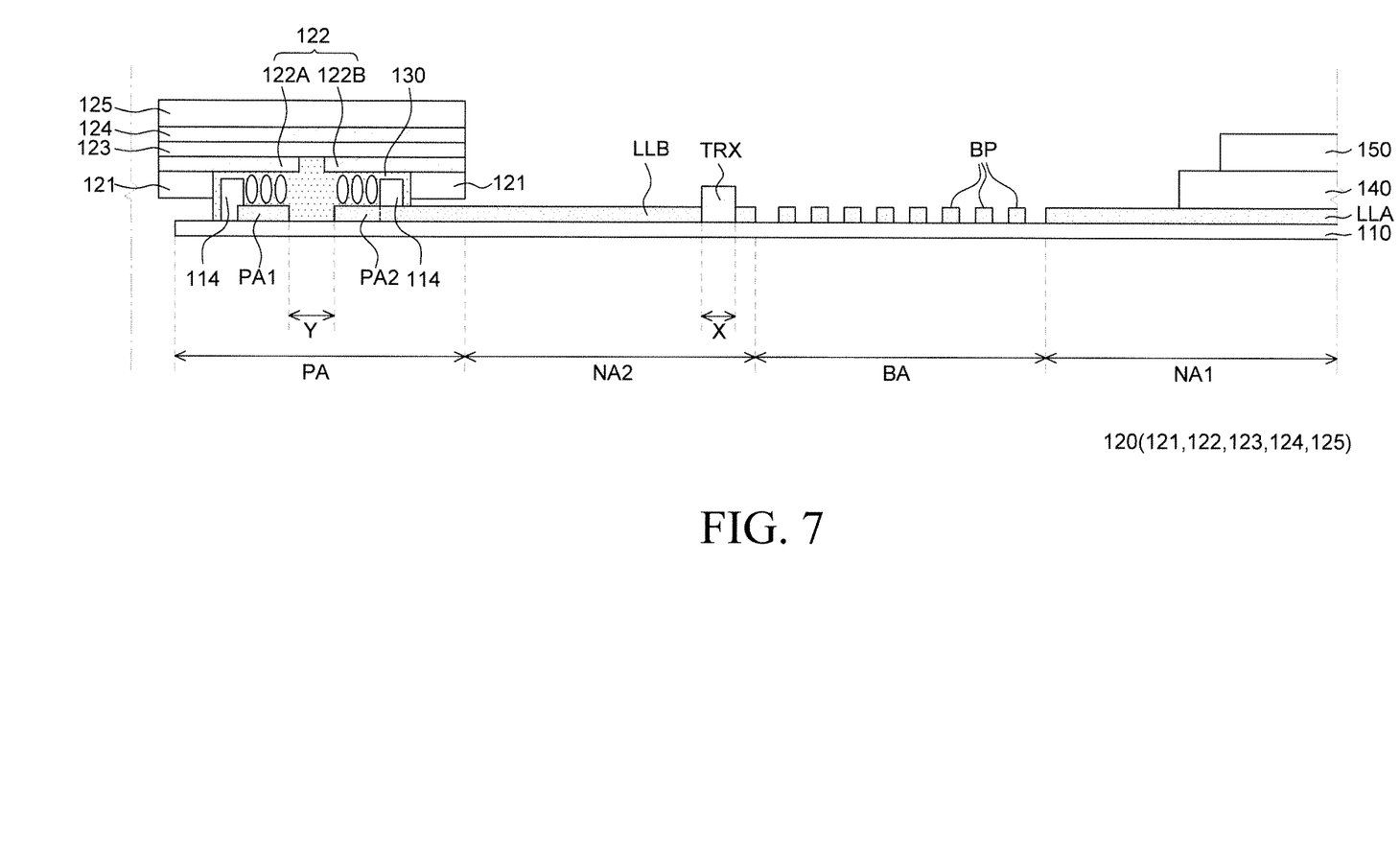

FIGS. 6 and 7 are cross-sectional views of a flexible display device according to a comparative example. The flexible display device according to the comparative example is substantially the same as the flexible display device 100 according to an embodiment of the present disclosure as illustrated in FIGS. 1 to 5 except for the plurality of inspection transistors TRX disposed between an end of the bending area BA and an end of the second non-display area NA2.

Referring to FIG. 7, a plurality of inspection transistors TRX of the flexible display device according to the comparative example can inspect any possible defects with respect to the plurality of link lines LL disposed in the bending area BA and the first non-display area NA1, a plurality of data lines DL in the display area A/A, and a plurality of pixels. However, the inspection data voltage applied to the plurality of inspection transistors TRX is applied only in the direction toward the display area A/A. Therefore, any defects of the second lines LLB of the plurality of link lines LL arranged in the second non-display area NA2 and the pad area PA of the plurality of inspection transistors TRX cannot be inspected.

In contrast to the comparative example, in the flexible display device 100 according to an embodiment of the present disclosure, a plurality of inspection transistors TR1 are arranged in the pad area PA. Accordingly, any cracks can be inspected for not only the second lines LLB of the plurality of link lines LL in the display area A/A, the first non-display area NA1, and the bending area BA but also for the second lines LLB of the plurality of link lines LL in the second non-display area NA2 and the pad area PA.

In addition, the flexible display device 100 according to an embodiment of the present disclosure can further reduce the size of the bezel as compared with the flexible display device according to the comparative example. For the quantitative comparison, the length of the space occupied by the plurality of inspection transistors TR, that is, the length of the space occupied by the first inspection transistor TR1 as illustrated in FIG. 5 is assumed as "A" of the flexible display device 100 according to an embodiment of the present disclosure.

Further, the length of the space occupied by the plurality of inspection transistors TRX of the flexible display device according to the comparative example is assumed as "X" and the minimum separation distance between the first pad PA1 and the second pad PA2 required for the manufacturing process is assumed as "Y".

As described above, in the flexible display device 100 according to an embodiment of the present disclosure and the flexible display device according to the comparative example, only the positions of the inspection transistors TR and TRX are different. Therefore, the difference between the length of the non-display area NA of the flexible display device 100 according to an embodiment of the present disclosure and the length of the non-display area NA of the flexible display device according to the comparative example can be derived as an equation that "A−(X+Y)".

First, in the comparative example, when the length X of the space occupied by the plurality of inspection transistors TRX is larger than the minimum separation distance Y between the first pad PA1 and the second pad PA2, the length A of the space occupied by the plurality of inspection transistors TR in the flexible display device 100 according to an embodiment of the present disclosure is equal to the length X of the space occupied by the plurality of inspection transistors TRX in the comparative example. Therefore, in this instance, the difference between the length of the non-display area NA of the flexible display device 100 according to an embodiment of the present disclosure and the length of the non-display area NA of the flexible display device according to the comparative example is −Y. Consequently, it can be seen that the length of the non-display area NA of the flexible display device 100 according to an embodiment of the present disclosure is smaller than the length of the non-display area NA of the flexible display device according to the comparative example.

Next, in the comparative example, when the length X of the space occupied by the plurality of inspection transistors TRX is smaller than the minimum separation distance Y between the first pad PA1 and the second pad PA2, the length A of the space occupied by the plurality of inspection transistors TR in the flexible display device 100 according to an embodiment of the present disclosure is equal to the minimum separation distance Y between the first pad PA1 and the second pad PA2 of the comparative example. Therefore, in this instance, the difference between the length of the non-display area NA of the flexible display device 100 according to an embodiment of the present disclosure and the length of the non-display area NA of the flexible display device according to the comparative example is −X. Consequently, it can be seen that the length of the non-display area NA of the flexible display device 100 according to an embodiment of the present disclosure is smaller than the length of the non-display area NA of the flexible display device according to the comparative example.

In summary, when the flexible display device 100 according to an embodiment of the present disclosure is compared with the flexible display device according to the comparative example, the flexible display device 100 according to an embodiment of the present disclosure can inspect the defects of wirings arranged in a wider area than the flexible display device according to the comparative example. In addition, the length of the non-display area N/A can be further reduced, and the bezel size can be reduced.

Figure 8:
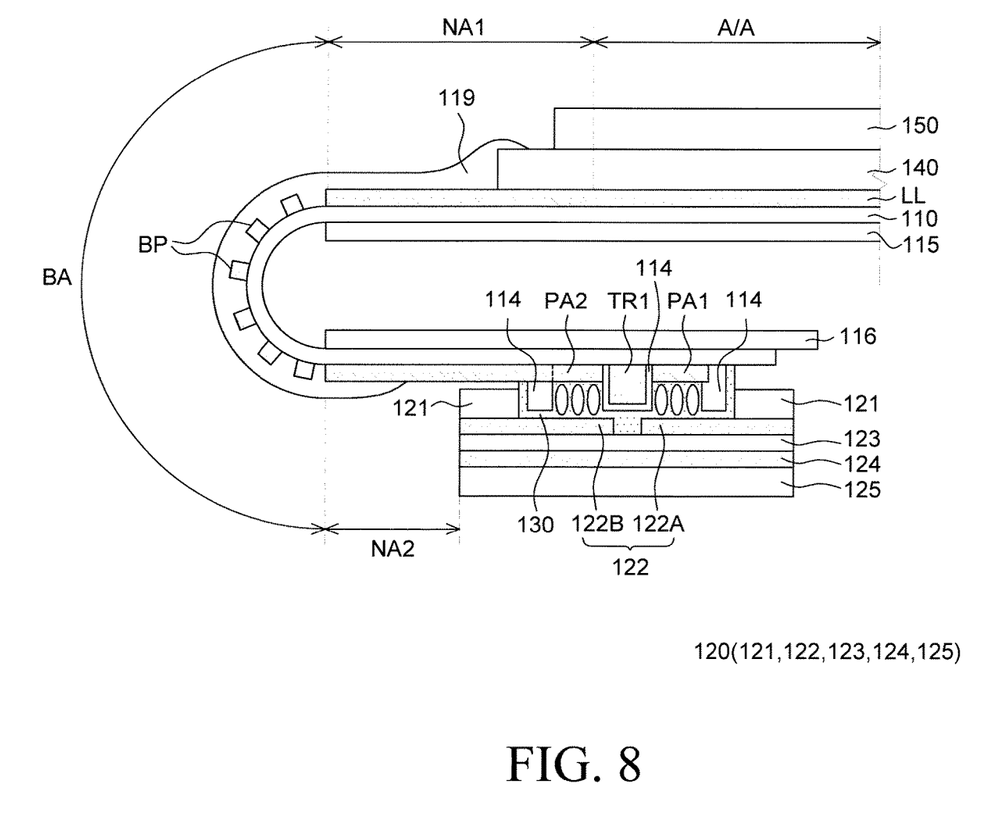
FIG. 8 is a cross-sectional view of a flexible display device according to an embodiment of the present disclosure in a bent state.

FIG. 8 is a cross-sectional view of a flexible display device according to an embodiment of the present disclosure in a bent state.

Referring to FIG. 8, the flexible display device 100 may further include back plates 115 and 116 and a coating layer 119.

The back plates 115 and 116 may include the first back plate 115 disposed below the flexible substrate 110 corresponding to the display area A/A of the flexible substrate 110 and a second back plate 116 disposed corresponding to the flexible film 120 and positioned under the first back plate 115 when bent.

The first back plate 115 and the second back plate 116 can support the flexible substrate 110. The first back plate 115 can maintain a plurality of pixels disposed on the display area A/A of the flexible substrate 110 in a planar state.

Further, the non-display area N/A of the flexible display device 100 may be provided with a coating layer 119 for suppressing moisture from penetrating and cracks in wiring. The coating layer 119 may be disposed to cover at least the bending area BA. That is, the coating layer 119 may be arranged to cover a portion of the first non-display area NA1 and the second non-display area NA2 near the bending area BA and the bending area BA. The coating layer 119 may be made of an insulating material, for example, an organic material.

Embodiments of the present disclosure can also be described as follows:

According to an aspect of the present disclosure, a flexible display device can include a flexible substrate including a display area in which a plurality of pixels are arranged, a first non-display area extended from the display area, a bending area extended from the first non-display area, a second non-display area extended from the bending area, and a pad area in which a plurality of pads are arranged, extended from the second non-display area, a plurality of data lines, configured to transmit a data voltage to the plurality of pixels, arranged in the display area, a plurality of link lines arranged in the first non-display area, the bending area, the second non-display area, and the pad area to connect each of the plurality of data lines and each of the plurality of pads, and a plurality of inspection transistors arranged in the pad area, the plurality of inspection transistors including a first electrode connected to each of the plurality of link lines.

The plurality of pads may include a plurality of first pads connected to a plurality of first link lines among the plurality of link lines, and a plurality of second pads, arranged to be closer to the display area than the plurality of first pads, connected to a plurality of second link lines among the plurality of link lines, in which the plurality of inspection transistors can be positioned between the plurality of first pads and the plurality of second pads in the pad area.

Each of the plurality of second link lines can include a protrusion portion extended from the plurality of second pads to or toward the plurality of first pads, and the first electrode of the plurality of inspection transistors can be connected to the plurality of second link lines at the protrusion portion.

The flexible display device can include a plurality of enable signal lines connected to a gate electrode of the plurality of inspection transistor, a plurality of inspection data lines connected to a source electrode or a drain electrode of the plurality of inspection transistor, and an inspection pad connected to the plurality of enable signal lines and the plurality of inspection data lines.

The flexible display device can include a flexible film including a base layer, a first conductive layer under the base layer, a second conductive layer on the base layer, a first protective layer covering at least a portion of the first conductive layer, and a second protective layer covering at least a portion of the second conductive layer, in which the first conductive layer of the flexible film can include a plurality of first conductive patterns connected to the plurality of first pads and a plurality of second conductive patterns connected to the plurality of second pads.

The flexible film can be on the plurality of first pads, the plurality of second pads, and the plurality of inspection transistors, and an organic layer can be disposed between the plurality of inspection transistors and the flexible film.

The inspection transistor can be configured to inspect turn-on of the plurality of pixels.

The inspection transistor can be configured to inspect any defect of the plurality of link lines disposed in the first non-display area, the bending area, and the second non-display area.

A corner of the display area can have a rounded shape.

An average width of the first non-display area can be wider than an average width of the second non-display area, and can be narrower than an average width of the display area.

An average interval between the plurality of link lines in the first non-display area can be larger than an average interval between the plurality of link lines in the second non-display area.

According to an another aspect of the present disclosure, a flexible display device can include a flexible substrate including a display area and a non-display area extended from the display area, the non-display area includes a bending area, a plurality of data lines arranged in the display area, a plurality of link lines, connected to each of the plurality of data lines, arranged in the non-display area, and having a bending pattern in the bending area, a plurality of pads connected to each of the plurality of link lines, and a plurality of inspection transistors electrically connected to the plurality of link lines and disposed more adjacent to the plurality of pads than the bending pattern.

The flexible display device can include a flexible film electrically connected to the plurality of pads and including a conductive layer, in which the plurality of inspection transistors can be overlapped with the flexible film.

The flexible display device can include an adhesive layer including conductive particles for electrically connecting the conductive layer of the flexible film and the plurality of pads, in which the plurality of inspection transistors can be overlapped with the adhesive layer.

The bending pattern can include at least one consecutive conductive pattern selected from among a diamond shape, a rhombic shape, a zigzag shape, and a circular shape.

The plurality of pads can include a plurality of first pads arranged as a line and a plurality of second pads alternatively arranged with the plurality of first pads as a line to be more adjacent to the bending area than the plurality of first pads, and the plurality of inspection transistors can be disposed between the plurality of first pads and the plurality of second pads.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical spirit of the present disclosure. The scope of the technical spirit of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A flexible display device comprising:
  a flexible substrate including:
    a display area including a plurality of pixels,
    a first non-display area extended from the display area,
    a bending area extended from the first non-display area,
    a second non-display area extended from the bending area, and
    a pad area extended from the second non-display area and including a plurality of pads;
  a plurality of data lines configured to transmit a data voltage to the plurality of pixels;
  a plurality of link lines extending through the first non-display area, the bending area, the second non-display area, and the pad area to connect the plurality of data lines with the plurality of pads; and
  a plurality of inspection transistors arranged in the pad area, each of the plurality of inspection transistors including a first electrode connected to one of the plurality of link lines.

2. The flexible display device of claim 1, wherein the plurality of pads include:
  a plurality of first pads respectively connected to a plurality of first link lines among the plurality of link lines; and
  a plurality of second pads respectively connected to a plurality of second link lines among the plurality of link lines, wherein the plurality of second pads are located closer to the display area than the plurality of first pads,
  wherein the plurality of inspection transistors are disposed between the plurality of first pads and the plurality of second pads in the pad area.

3. The flexible display device of claim 2, wherein each of the plurality of second link lines includes a protrusion portion extended from a corresponding second pad among the plurality of second pads in a direction toward the plurality of first pads, and
  wherein the protrusion portion connects the first electrode of one of the plurality of inspection transistors to one of the plurality of second link lines.

4. The flexible display device of claim 2, further comprising:
  a plurality of enable signal lines connected to a plurality of gate electrodes of the plurality of inspection transistors, respectively;
  a plurality of inspection data lines and each of the plurality of inspection data lines is connected to a source electrode or a drain electrode of one of the plurality of inspection transistors;
  a plurality of inspection data pads respectively connected to the plurality of inspection data lines; and
  a plurality of enable signal pads respectively connected to the plurality of enable signal lines.

5. The flexible display device of claim 2, further comprising:
  a flexible film disposed on the flexible substrate and including:
    a first conductive layer,
    a second conductive layer,
    a base layer disposed between the first conductive layer and the second conductive layer,
    a first protective layer covering at least a portion of the first conductive layer, and
    a second protective layer covering at least a portion of the second conductive layer,
  wherein the base layer and the first and second conductive layers are disposed between the first protective layer and the second protective layer, and
  wherein the first conductive layer of the flexible film includes a plurality of first conductive patterns respectively connected to the plurality of first pads and a plurality of second conductive patterns respectively connected to the plurality of second pads.

6. The flexible display device of claim 5, wherein the flexible film is disposed on the plurality of first pads, the plurality of second pads, and the plurality of inspection transistors, and
  wherein an organic layer is disposed between the plurality of inspection transistors and the flexible film.

7. The flexible display device of claim 1, wherein each of the plurality of inspection transistors is configured to inspect a turn-on state for one or more pixels among of the plurality of pixels.

8. The flexible display device of claim 1, wherein each of the plurality of inspection transistors is configured to identify a defect in the first non-display area, the bending area, and the second non-display area for a corresponding link line among the plurality of link lines.

9. The flexible display device of claim 1, wherein a corner of the display area has a rounded shape.

10. The flexible display device of claim 1, wherein an average width of the first non-display area is greater than an average width of the second non-display area, and
wherein the average width of the first non-display area is less than an average width of the display area.

11. The flexible display device of claim 1, wherein an average interval between the plurality of link lines in the first non-display area is larger than an average interval between the plurality of link lines in the second non-display area.

12. The flexible display device of claim 1, wherein the plurality of link lines include a bending pattern in the bending area, and
wherein the bending pattern includes at least one consecutive conductive pattern selected from among a diamond shape, a rhombic shape, a zigzag shape, or a circular shape.

13. The flexible display device of claim 1, wherein a width of the first non-display area decreases in a direction away from the display area, and
wherein a width of the second non-display area decreases in the direction away from the display area.

14. The flexible display device of claim 13, wherein an interval between the plurality of link lines in the first non-display area decreases in the direction away from the display area,
wherein an interval between the plurality of link lines in the second non-display area decreases in the direction away from the display area, and
wherein an interval between the plurality of link lines in the bending area remains constant.

15. A flexible display device comprising:
a flexible substrate including:
a display area,
a non-display area adjacent to the display area, and
a bending area in the non-display area;
a plurality of data lines disposed in the display area;
a plurality of link lines respectively connected to the plurality of data lines, disposed in the non-display area, and including a bending pattern in the bending area;
a plurality of pads respectively connected to the plurality of link lines; and
a plurality of inspection transistors electrically connected to the plurality of link lines, respectively, the plurality of inspection transistors disposed closer to the plurality of pads than the bending pattern,
wherein the plurality of pads include a plurality of first pads arranged in a line and a plurality of second pads alternatively arranged with the plurality of first pads in a line, and the plurality of second pads are disposed closer to the bending area than the plurality of first pads, and
wherein the plurality of inspection transistors are disposed between the plurality of first pads and the plurality of second pads.

16. The flexible display device of claim 15, further comprising a flexible film including a conductive layer electrically connected to the plurality of pads,
wherein the plurality of inspection transistors is overlapped with the flexible film.

17. The flexible display device of claim 16, further comprising an adhesive layer including conductive particles electrically connecting the conductive layer of the flexible film to the plurality of pads,
wherein the plurality of inspection transistors is overlapped with the adhesive layer.

18. The flexible display device of claim 15, wherein the bending pattern includes at least one consecutive conductive pattern selected from among a diamond shape, a rhombic shape, a zigzag shape, or a circular shape.

19. The flexible display device of claim 15, wherein each of the plurality of inspection transistors is configured to inspect a turn-on state for one or more pixels among of a plurality of pixels in the display area.

* * * * *